(12) United States Patent
Mori et al.

(10) Patent No.: US 10,643,910 B2
(45) Date of Patent: May 5, 2020

(54) FABRICATION OF A SACRIFICIAL INTERPOSER TEST STRUCTURE

(71) Applicant: INTERNATIONAL BUSINESS MACHINES CORPORATION, Armonk, NY (US)

(72) Inventors: Hiroyuki Mori, Shiga-ken (JP); Keishi Okamoto, Kanagawa (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/104,433

(22) Filed: Aug. 17, 2018

(65) Prior Publication Data

US 2019/0006250 A1 Jan. 3, 2019

Related U.S. Application Data

(63) Continuation of application No. 15/176,935, filed on Jun. 8, 2016, now Pat. No. 10,109,540.

(51) Int. Cl.
| | |
|---|---|
| *H01L 21/66* | (2006.01) |
| *H01L 23/498* | (2006.01) |
| *H01L 21/48* | (2006.01) |
| *G01R 31/26* | (2020.01) |
| *G01R 31/28* | (2006.01) |
| *G01R 31/44* | (2020.01) |

(52) U.S. Cl.
CPC .......... *H01L 22/32* (2013.01); *G01R 31/2637* (2013.01); *G01R 31/2884* (2013.01); *G01R 31/44* (2013.01); *H01L 21/486* (2013.01); *H01L 22/14* (2013.01); *H01L 23/49827* (2013.01); *H01L 23/49838* (2013.01); *H01L 23/49822* (2013.01)

(58) Field of Classification Search
CPC ... H01L 22/32; H01L 22/14; H01L 23/49827; H01L 23/49838; H01L 21/486; G01R 31/2637
See application file for complete search history.

(56) References Cited

U.S. PATENT DOCUMENTS

| | | | |
|---|---|---|---|
| 6,333,563 B1 | 12/2001 | Jackson et al. | |
| 8,823,144 B2 | 9/2014 | Khan et al. | |
| 8,952,533 B2 | 2/2015 | Mohammed et al. | |
| 9,435,846 B2 * | 9/2016 | DeLaCruz | G01R 31/025 |
| 9,989,572 B1 * | 6/2018 | Chaware | G01R 31/021 |
| 2010/0155888 A1 * | 6/2010 | Christo | H01L 21/6835 |
| | | | 257/532 |

(Continued)

OTHER PUBLICATIONS

Lueck, et al., "Temporary Wafer Bonding Materials and Processes", Center for Materials and Electronic Technologies, RTI International, Mar. 2012, 4 pages. Abstract Only.

(Continued)

*Primary Examiner* — Syed I Gheyas
(74) *Attorney, Agent, or Firm* — Tutunjian & Bitetto, P.C.; Vazken Alexanian

(57) ABSTRACT

A sacrificial interposer test structure including a release layer, a dummy layer on the release layer, one or more conductive pads embedded in the dummy layer, wherein each of the one or more conductive pads has an exposed surface, and a tie layer on the dummy layer and on each exposed surface of the one or more conductive pads.

20 Claims, 11 Drawing Sheets

(56) References Cited

U.S. PATENT DOCUMENTS

2013/0249589 A1* 9/2013 Chen .................. H01L 22/14
324/762.01
2015/0262928 A1 9/2015 Shen et al.

OTHER PUBLICATIONS

Okamoto, et al., "Electrical Assessment of Chip to Chip Connection for Ultra High Density Organic Interposer", ICEP Proceedings, Apr. 2014, pp. 55-59.
Romero, et al., "High Density Organic interposer with Fine Feature Size for Advanced Packaging Applications", International Microelectronics Assembly and Packaging Society, Sep. 2014, 1 page. Abstract Only.
Romero, et al., "A Small Feature-Sized Organic interposer for 2.1D Packaging Solutions", International Symposium on Microelectronics: FALL 2014, pp. 000619-000623, vol. 2014, No. 1. Abstract Only.
Wu, et al., "Modeling, Design and Fabrication of Ultra-thin and Low CTE Organic Interposers at 40μm I/O pitch", Electronic Components and Technology Conference (ECTC), IEEE, May 2015, pp. 301-307.
List of IBM Patents or Patent Applications Treated as Related dated Aug. 17, 2018, 2 pages.

* cited by examiner

FABRICATION OF A SACRIFICIAL INTERPOSER TEST STRUCTURE

BACKGROUND

Technical Field

The present invention relates to fabrication of organic interposers, and more particularly to organic interposers configured to be electrically tested from a front surface.

Description of the Related Art

Interposers typically provide electrical lines that connect integrated circuit (IC) components (e.g., dies) to packaging components to facilitate electrical connections with printed circuit boards (PCBs) or other external mounting surfaces. An interposer may provide different contact densities for connecting ultra-high density IC connections to larger, lower density electrical contacts on the package.

SUMMARY

A sacrificial interposer test structure including a release layer, a dummy layer on the release layer, one or more conductive pads embedded in the dummy layer, wherein each of the one or more conductive pads has an exposed surface, and a tie layer on the dummy layer and on each exposed surface of the one or more conductive pads.

A method of fabricating a sacrificial interposer test structure including forming a release layer on a substrate, forming a dummy layer on the release layer, patterning and developing the dummy layer to form one or more recesses in the dummy layer, forming conductive pads in the one or more recesses in the dummy layer, wherein each of the one or more conductive pads has an exposed surface, and forming a tie layer on the dummy layer and on each exposed surface of the one or more conductive pads.

A method of testing an interposer including forming a sacrificial test structure, forming an interposer on the sacrificial test structure, wherein the interposer includes a body and a plurality of electrically connected interposer contacts and chip contacts embedded in the body, where at least a portion of the electrically connected interposer contacts are in electrical contact with the sacrificial test structure, and attaching at least two test probes to at least two different chip contacts on the surface of the interposer, wherein a resistance between the electrically connected interposer contacts is measured to determine if a conductive path between the electrically connected interposer contacts is open or closed.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
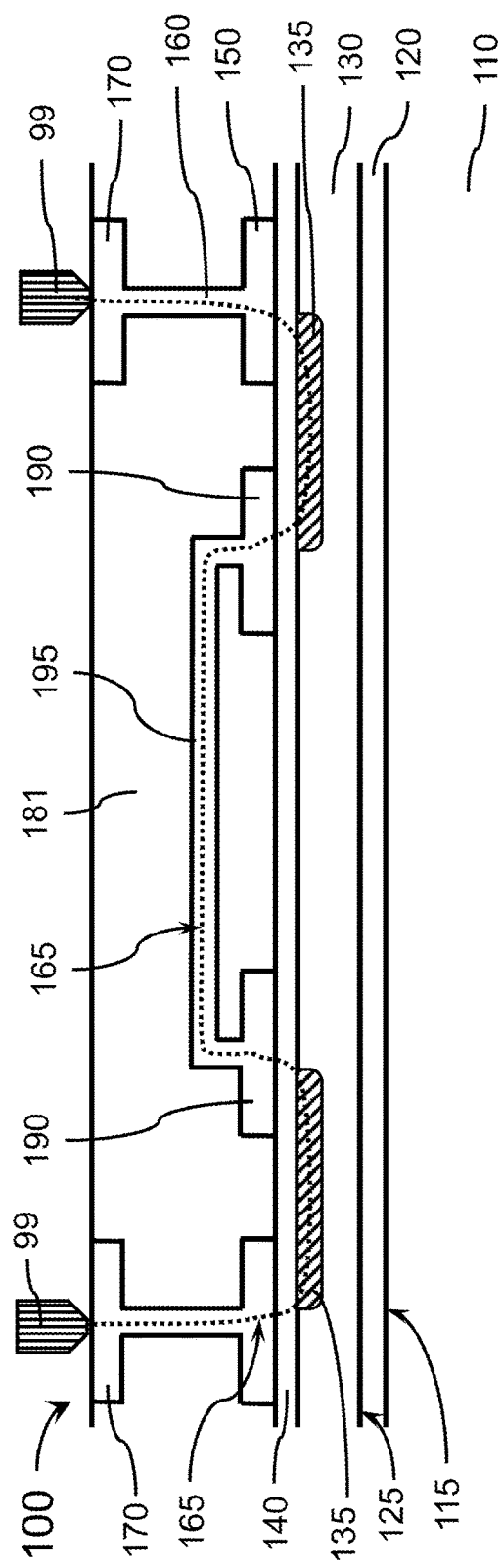
FIG. 1 is a cross-sectional view of a sacrificial interposer test structure fabricated on a substrate according to an illustrative embodiment.

Principles and embodiments of the present disclosure relate generally to an interposer that can connect ultra-high density circuitry, which may be in the form of a vertical or horizontal die stack, with second level packaging that may have a courser pitch of electrical contacts (e.g., microbumps) than the finer pitch for the integrated circuit (IC) contacts. The interposer may include thru-vias that function as a space transformer to electrically connect the different contact pitches on opposite sides of the interposer, where a space transformer bridges the change in pitch from the IC contacts to a courser pitch of electrical contacts, for example in the second level packaging.

An interposer may be utilized with ultra-high density circuitry, which may be for example, graphics processing units (GPUs), high bandwidth memory (HBM), and/or high performance computing (HPC) components using parallel processing (e.g., multi-core processors). An aspect of an interposer is its quality, which can determine the yield ratio of the devices using an interposer. Flaws in an interposer's fabrication may render an entire device inoperable due to certain connections in the interposer being open or shorted even though the IC device, itself, is functional. Confirming that the interconnections of an interposer are defect-free can reduce or avoid the production and subsequent waste resulting from the use of inoperable interposers for manufacturing devices.

Testing of the electrical connections (e.g., thru-vias, lines, interconnects, etc.) between the IC contacts (e.g., chip contacts) and the second level packaging contacts (e.g., interposer contacts) before the final connections are made with the IC packaging can be difficult or impossible because of the manner in which the interposer may be handled. In various instances, only a single surface of the interposer may be available for forming electrical contacts with testing equipment, while the opposite side of the interposer is mounted to a support substrate. Such a configuration may prevent access to interconnects only present on the covered side of the interposer. These interconnects, therefore, may not be testable until packaging is completed. Delaying testing of interposers until such connection are made can result in the fabrication of faulty chip packages that may need to be discarded.

In various embodiments, separate layers may be formed on the support substrate prior to formation of an interposer, where the separate layers may be configured to provide electrical connections to the interposer contacts that would otherwise be buried at the interface between the interposer and support substrate. In various embodiments, the separate layers may be configured to complete electrical circuits to electrical contacts on the exposed surface of the interposer. At least some of the separate layer(s) may be sacrificial layers that are formed to allow electrical testing by providing electrical connections to the interposer contacts that would otherwise be buried, but may be removed after testing of the interposer's structure and performance.

Principles and embodiments of the disclosure also relate generally to a wiring defect inspection method for die-to-packaging substrate connections, where the wiring may include thru-vias and conductive lines of an interposer, and the inspection determines open circuit(s) and/or short(s) in the wiring.

Principles and embodiments of the disclosure may also relate generally to a process of forming an interposer with ultra-high density (e.g., L/S=1 μm) and/or high input/output (I/O) counts that can be fully tested from a single side of the interposer. The wiring defect inspection method may be conducted without transferring the interposer to a second substrate to expose contacts on the opposite side of the interposer.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed below could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Effectively packaging an ultra-high density integrated circuit (IC) can be a challenge due to a difference between pitches for the die-side electrical contacts and the package-side electrical contacts for enlarging an input/output contact pattern to a manageable size, while still providing mechanical support and thermal management.

Referring now to the drawings in which like numerals represent the same or similar elements and initially to FIG. 1, which is a cross-sectional view of a sacrificial interposer test structure fabricated on a substrate according to an illustrative embodiment.

In one or more embodiments, a release layer 120 may be formed on a substrate 110. The substrate may provide a flat, rigid, and stable surface for forming an interposer 100. The release layer 120 may have a first surface 122 and a second surface 125 opposite the first surface with a thickness therebetween, wherein the first surface 122 may be in contact with a top surface 115 of substrate 110, and the second surface 125 may be in contact with a dummy layer 130.

In various embodiments, the release layer 120 may provide an interface that allows the substrate 110 to be separated from one or more layers and/or components formed on the surface 125 of the release layer 120 opposite the surface 122 in contact with the substrate surface 115, where the layers and components may be a sacrificial test structure. In various embodiments, the substrate may be a semiconductor or insulator material, for example, a glass plate or silicon wafer that provides structural support for formation and handling of an interposer and additional layers on the interposer.

In one or more embodiments, the release layer 120 may have a thickness in the range of about 0.5 um to about 2 um, or about 0.75 um to about 1.5 um, or about 1 um to about 1.25 um. The release layer 120 may be formed of a material that debonds from the substrate surface 115 subsequent to the interface with the substrate undergoing a debonding process involving being exposed to a laser.

In one or more embodiments, the release layer 120 may have a thickness in the range of about 30 um to about 50 um, where the release layer 120 may be formed of a material that debonds from the substrate surface 115 subsequent to the interface with the substrate undergoing a debonding process involving mechanical stresses (e.g., peeling).

In one or more embodiments, the release layer 120 may have a thickness in the range of about 5 um to about 30 um, where the release layer 120 may be formed of a material that debonds from the substrate surface 115 subsequent to the interface with the substrate undergoing a debonding process involving thermal treatment.

In one or more embodiments, the release layer 120 may have a thickness in the range of about 40 um to about 100 um, where the release layer 120 may be formed of a material that debonds from the substrate surface 115 subsequent to the interface with the substrate undergoing a debonding process involving formation of bubbles or voids.

In one or more embodiments, the release layer 120 may be a temporary wafer bonding material, where the temporary wafer bonding material may be an organic material, for example, an acrylic adhesive, a thermoplastic (e.g., poly ethylene, poly(methyl methacrylate)), a silicon elastomer, or polyimide.

In one or more embodiments, a dummy layer 130 may be formed on the surface 125 of the release layer 120. The dummy layer may be formed of a photoresist resin (e.g., a dry film type or liquid permanent photo resist, SU-8, novolac resin, poly(methyl methacrylate) (PMMA), polyhydroxystyrene-based polymers, etc.). The photoresist resin may be a positive resist or a negative resist. The material of the dummy layer 130 may be different from the material of the release layer 120.

In various embodiments, the dummy layer may have a thickness in the range of about 5 um to about 40 um, or in the range of about 10 um to about 30 um, or in the range of about 15 um to about 25 um, or about 20 um.

In one or more embodiments, the dummy layer 130 may be patterned and portions of the dummy layer removed (e.g., by etching, development of the resist, stripping, etc.) to form recesses into which a conductor (e.g., metal, bi-metallic compound, metal carbide, metal nitride, etc.) may be deposited. In various embodiments, the conductor may include an interlayer layer 134 that forms conductive pad(s) 135 located at positions where an interposer contact, which may be an interposer via contact 150, or interposer lead contact 190, will be located. Copper may be electroplated onto the metal interlayer 134 to form a conductive pad 135 of sufficient thickness in a recess. The copper may be chemically-mechanically polished (CMP) to remove excess material, and/or form conductive pads 135 having a flat surface and intended thickness.

In various embodiments, the conductive pad(s) 135 may have a thickness in the range of about 5 um to about 40 um, or in the range of about 10 um to about 30 um, or in the range of about 15 um to about 25 um, or about 20 um. In various embodiments, the thickness of the conductive pad(s) 135 is less than the thickness of the dummy layer 130, so at least a thin portion of the dummy layer separates the conductive pad(s) 135 from the release layer 120.

In various embodiments, a conductive pad 135 may span the distance separating two or more interposer via contacts 150 and/or interposer lead contacts 190, such that the conductive pad 135 or two or more electrically connected conductive pads 135 form a conductive bridge between the two or more interposer contacts 150, 190. The interposer contacts 150, 190 may be neighboring interposer contacts, without other intervening contact areas.

In one or more embodiments, a tie layer 140 may be formed on the dummy layer 130 and conductive pads 135. The tie layer 140 may cover all of the dummy layer 130 and conductive pads 135, or portions of the dummy layer 130 and conductive pads 135. In various embodiments, the tie layer 140 may include two or more layers, where the tie layer 140 may be a Ti/Cu bi-layer. A thin Ti layer may be formed on the dummy layer 130 and conductive pads 135 first followed by a Cu layer formed on the Ti layer, where the Ti layer may be a wetting/seed layer and/or barrier layer. In various embodiments, the tie layer provides a conductive interface between the conductive pad(s) 135 and interposer contact(s) 150, 190. The tie layer 140 may be formed by sputtering the material(s) onto the dummy layer 130 and conductive pads 135, or portions of the dummy layer 130 and conductive pads 135.

In various embodiments, the Ti seed layer may have a thickness in the range of about 5 nm to about 50 nm, or in the range of about 15 nm to about 40 nm, or in the range of about 25 nm to about 30 nm. In various embodiments, the Cu layer formed on the Ti layer may have a thickness in the range of about 7 nm to about 40 nm, or in the range of about 15 nm to about 30 nm, or in the range of about 25 nm to about 30 nm. A thicker Cu layer may provide a lower electrical resistance. A measurable difference in electrical resistance between the Ti seed layer and the Cu layer may allow detection of electrical current flowing through the Cu layer compared to an electrical current flowing only through the Ti seed layer, where the current may flow laterally through the Ti layer and/or Cu layer between conductive pads 135 and/or interposer contact(s) 150, 190.

In various embodiments, an interposer 100 may include a plurality of layers forming an interposer body 105 and a plurality of electrical connections within the interposer body. The interposer body may be formed of an organic material (e.g., polyimide) that supports and electrically isolates the various electrical connections of the interposer from each other. To avoid warping, the interposer body 105 may be formed on a rigid substrate 110, where warping might otherwise occur due to different stresses in the plurality of layers.

In one or more embodiments, interposer via contacts 150 and/or interposer lead contacts 190 may be formed on the tie layer 140 using a sacrificial layer (e.g., temporary resist) that can be patterned and developed. Interposer via(s) 160 may be formed from the interposer via contact(s) 150 to chip contact(s) 170. An insulator material 181 may surround the interposer via(s) 160, and the unexposed portions of the interposer contact(s) 150, 190 and the chip contact(s) 170. The insulator material 181 may fill the space between the different interposer via contacts 150, interposer lead contacts 190, chip contact(s) 170, and interposer via(s) 160 to form a body 105 of the interposer 100. The interposer via(s) 160 may provide an electrical connection from a interposer via contact 150 to a chip contact 170 through the interposer body 105. An interposer lead 195 may form an electrical connection between two or more interposer lead contacts 190. An interposer via 160 may transverse the width of the interposer body 105 vertically, while an interposer lead contact 190 may transverse the interposer body 105 in the horizontal plane of the transposer body 105.

In various embodiments, the interposer via(s) 160 may have a diameter in the range of about 10 um to about 25 um, although other sizes are contemplated. The openings for the vias 160 may be formed using a laser (e.g., UV, excimer).

In various embodiments, the interposer body 105 may have a thickness in the range of about 50 um to about 80 um, or in the range of about 60 um to about 70 um, although other thicknesses are contemplated. In various embodiments, the interposer via contact(s) 150 and chip contact(s) 170 may have a thickness in the range of about 5 um to about 30 um, or about 10 um to about 20 um, or about 12 um to about 18 um, although other thicknesses are contemplated. The interposer via(s) 160, interposer contact(s) 150, and chip contact(s) 170 may be copper, and the interposer body 105 may be polyimide.

In various embodiments two or more interposer lead contacts 190 may be electrically connected by an interposer lead 195, where the interposer lead may be formed of copper.

The conductive pad(s) 135 in conjunction with the tie layer 140, interposer contact(s) 150, interposer via(s) 160, chip contact(s) 170, and interposer lead(s) 195, may provide a conductive path 165 between at least two contact points at which test probes 99 may be brought into electrical contact with the accessible surface(s) of the chip contact(s) 170.

A complete conductive path 165, as shown in FIG. 1, may be indicated by a negligible (e.g., expected resistance for copper conductor) end-to-end resistance between the probes 99.

Figure 2:
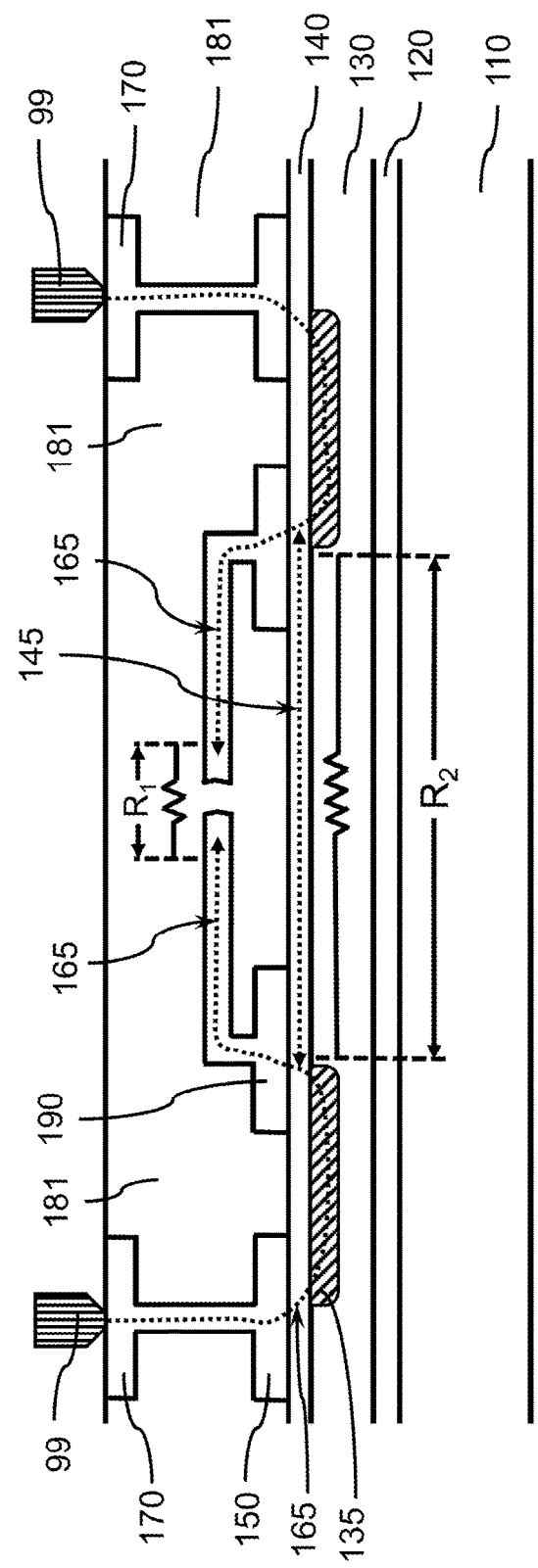
FIG. 2 is a cross-sectional side view of an interposer depicting a defective (e.g., broken/interrupted) interposer lead directly accessible only from the substrate covered side of the interposer according to an illustrative embodiment.

FIG. 2 is a cross-sectional side view of an interposer depicting a defective (e.g., broken/interrupted) interposer lead 195 accessible only from the substrate covered side of the interposer according to an illustrative embodiment.

A defective (e.g., broken/interrupted) conductive path 165 over the interposer contact(s) 150, interposer via(s) 160, chip contact(s) 170, and interposer lead(s) 195, may have a large (e.g., open (infinite)) resistance, $R_1$, introduced by a defect, for example, a break in an interposer via 160 and/or an interposer lead 195 that would indicate that the interposer 100 is defective, and should not be used to fabricate a device. A defect may be introduced by an incomplete deposition process, pinching/void formation, thermal expansion/contraction during processing, mechanical stress during handling, etc. In various embodiments, an electrical test current may find an alternative conductive path 145 through the tie layer 140, where the material (e.g., Ti/Cu) of the tie layer 140 introduces a different, measurable resistance, $R_2$. A resistance, $R_2$, measured between test probes 99 may indicate that the defect is located in an interposer lead 195, that could not be tested without conductive pads 135 completing the circuit from test probes 99 to the interposer contact(s) 190. Measurement of the resistances, $R_1$, $R_2$, may be used to determine the location of a wiring defect, and determination if the interposer can be used in a particular application.

Figure 3:
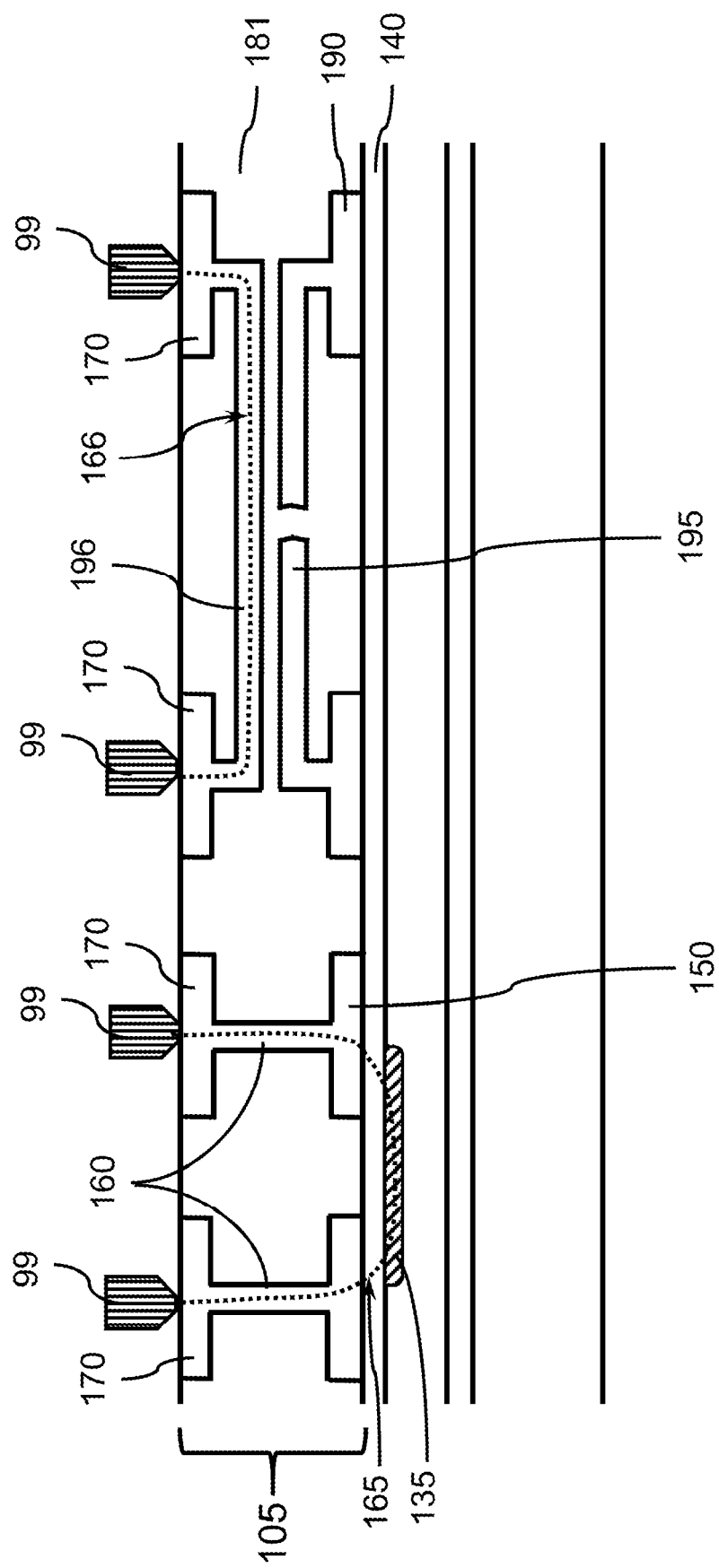
FIG. 3 is a cross-sectional view of a sacrificial interposer test structure fabricated on a substrate according to an illustrative embodiment.

FIG. 3 is a cross-sectional view of a sacrificial interposer test structure fabricated on a substrate according to an illustrative embodiment.

Two or more chip contact(s) 170 may be electrically connected by an interposer lead 196, as shown. In such instances, a defect in interposer lead 196 may be detected by a resistance measured across test probes 99 without a need for a conductive pad 135 to complete the conductive path 166. In various embodiments, an interposer lead 196 may have a resistance over conductive path 166 that can be compared with an adjacent conductive path 165 having a separate resistance, where a high resistance over a different conductive path above or below conductive path 166 may indicate what fabrication level in the interposer may be defective.

Figure 4:
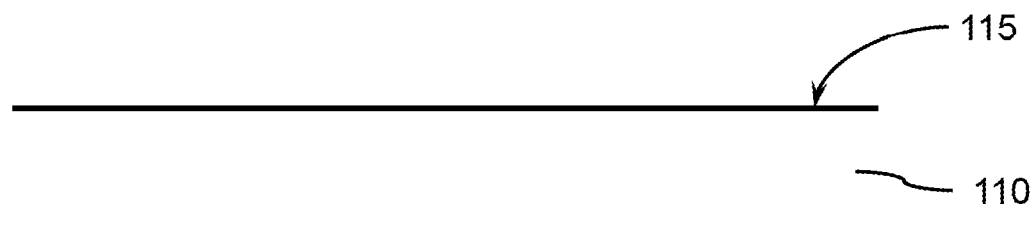
FIG. 4 is a cross-sectional view of a substrate in accordance with an illustrative embodiment according to an illustrative embodiment.

FIG. 4 is a cross-sectional view of a substrate in accordance with an illustrative embodiment.

In one or more embodiments, a substrate 110 may be a conductor, a semiconductor, or an insulator material that can act as a support for formation of an interposer 100. The substrate 100 may be a metal sheet, a glass or ceramic plate, or a semiconducting wafer, where additional material layers may be formed on the substrate 100. At least one exposed substrate surface 115 of the substrate may be suitable for formation of additional layers which may make up an interposer 100. The substrate surface 115 may be processed, prepared, and/or treated prior to the formation of additional layers, which may include but not be limited to chemical-mechanical polishing, heat treating/annealing, etching, cleaning, and/or chemical modification (e.g., passivation, hydroxyl formation, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Figure 5:
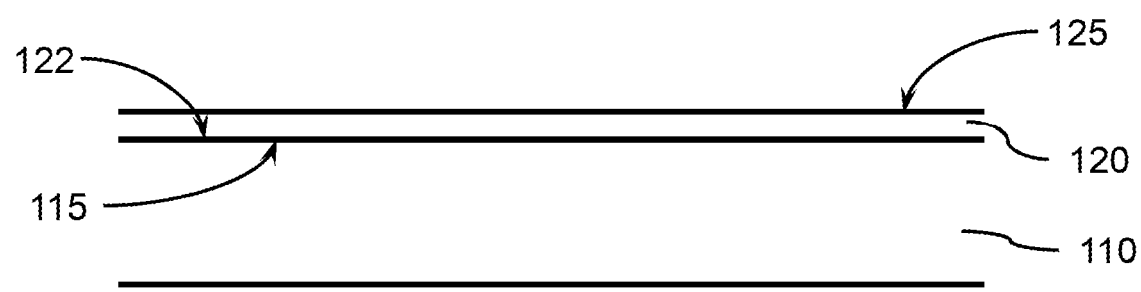
FIG. 5 is a cross-sectional view of a substrate with a release layer formed thereon in accordance with an illustrative embodiment.

FIG. 5 is a cross-sectional view of a substrate with a release layer formed thereon in accordance with an illustrative embodiment.

In one or more embodiments, a release layer 120 may be formed on substrate surface 115, where release layer 120 may be deposited by spin coating the release layer material onto the substrate surface 115.

In one or more embodiments, the release layer 120 has an exposed surface 125 that is suitable for formation of additional layers including resists, conductors, and one or more layers that may form an interposer 120.

In various embodiments, the release layer 120 may be a material that allows the substrate 110 to be detached through a controlled process from layers subsequently formed on the release layer 120. In various embodiments, the release layer 120 may include but not be limited to, an acrylic adhesive, a thermoplastic (e.g., poly ethylene, poly(methyl methacrylate)), a silicon elastomer, or polyimide.

Figure 6:
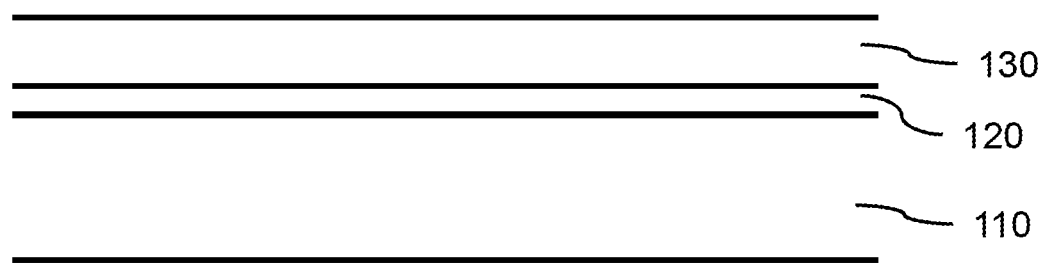
FIG. 6 is a cross-sectional view of a substrate with a release layer and dummy layer formed thereon in accordance with an illustrative embodiment.

FIG. 6 is a cross-sectional view of a substrate with a release layer and dummy layer formed thereon in accordance with an illustrative embodiment.

In one or more embodiments, a dummy layer 130 may be formed on the release layer 120, where the dummy layer may be a dry film or permanent liquid photoresist resin (e.g., SU-8, novolac resin, poly(methyl methacrylate) (PMMA), polyhydroxystyrene-based polymers). The photoresist resin may be a positive resist or a negative resist. In various embodiments, the dummy layer 130 may be deposited by spin coating the resin onto the surface 125 of the release layer.

Figure 7:
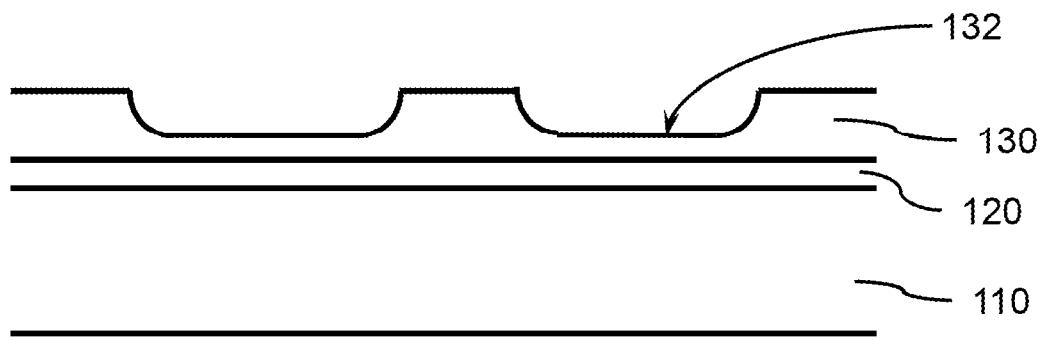
FIG. 7 is a cross-sectional view of a substrate with a release layer and dummy layer having patterned recesses in accordance with an illustrative embodiment.

FIG. 7 is a cross-sectional view of a substrate with a release layer and dummy layer having patterned recesses in accordance with an illustrative embodiment.

In one or more embodiments, the dummy layer 130 may be patterned and developed (e.g., by lithography, e-beam, etc.) to form recesses 132 having an intended depth. The depth of the recess(es) 132 may be less than or equal to the thickness of the dummy layer.

Figure 8:
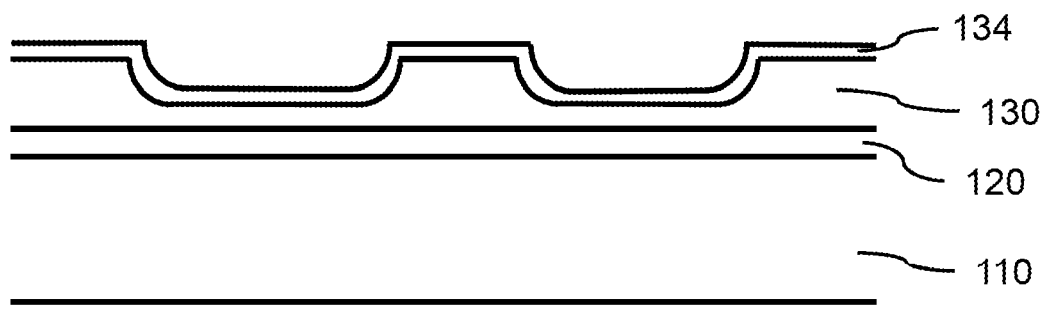
FIG. 8 is a cross-sectional view of a substrate with a release layer and patterned dummy layer, as shown in FIG. 7, with a metal interlayer in accordance with an illustrative embodiment.

FIG. 8 is a cross-sectional view of a substrate with a release layer and patterned dummy layer, as shown in FIG. 7, with a metal interlayer in accordance with an illustrative embodiment.

In one or more embodiments, a metal interlayer 134 may be formed over the surface of the dummy layer 130 and recesses 132, where the metal interlayer may be a thin metal layer that provides wetting and/or improved adhesion for a subsequent metal layer formed thereon. In various embodiments, the metal interlayer 134 may be a wetting layer for copper, for example, titanium, zirconium, hafnium, tantalum, chromium, molybdenum, tungsten, nickel, cobalt, ruthenium, rhodium, palladium, osmium, iridium, platinum, gold, silver, titanium-tungsten, tantalum nitride, or titanium nitride. In various embodiments, the metal interlayer 134 may be titanium, titanium nitride, or molybdenum. Metal interlayer 134 may be deposited by ALD, CVD, PVD (e.g., sputtering), as well as variations and/or combinations thereof.

Figure 9:
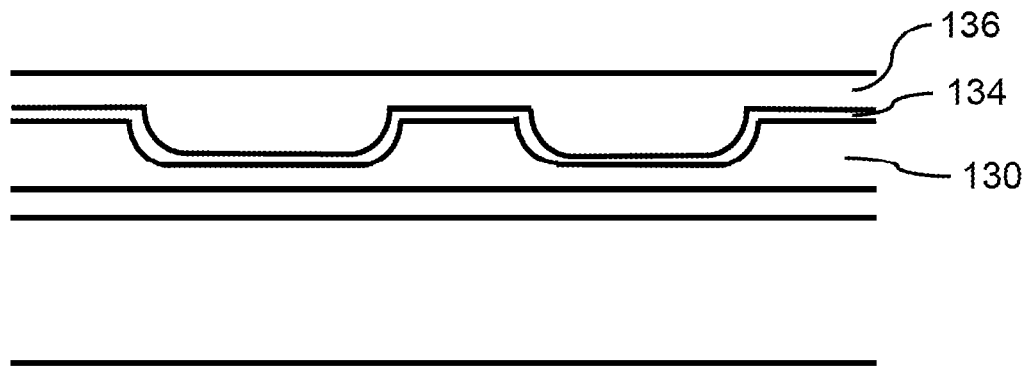
FIG. 9 is a cross-sectional view of a substrate with a release layer, dummy layer, and metal interlayer, as shown in FIG. 8, with an additional metal contact layer in accordance with an illustrative embodiment.

FIG. 9 is a cross-sectional view of a substrate with a release layer, dummy layer, and metal interlayer, as shown in FIG. 8, with an additional metal contact layer in accordance with an illustrative embodiment.

In one or more embodiments, a metal contact layer 136 may be formed on metal interlayer 134 to provide a thicker metal layer in at least the recesses 132. In various embodiments, metal contact layer 136 may be wet-chemically or electrochemically deposited on the metal interlayer 134, where metal contact layer 136 may be same metal or a different metal than metal interlayer 134. The metal contact layer 136 may be copper. The metal contact layer 136 may extend above the level of the dummy layer 130 to ensure the recesses 132 are completely filled. Excess material of the metal contact layer 136 may be removed by chemical-mechanical polishing (CMP).

Figure 10:
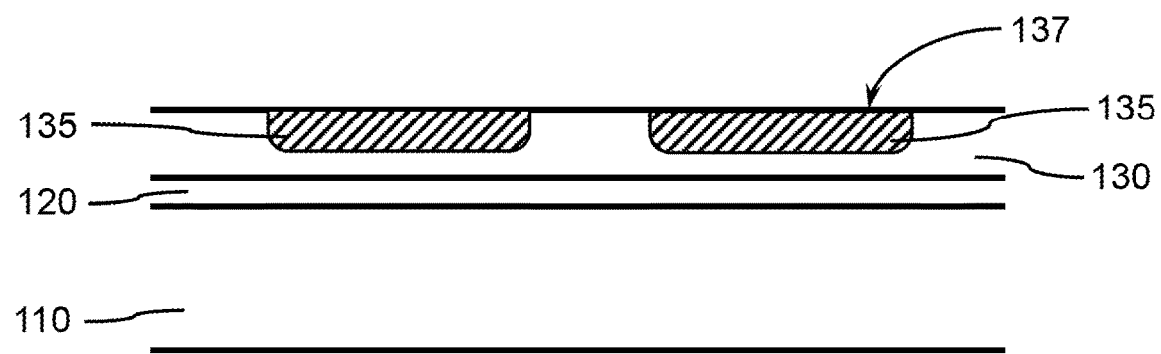
FIG. 10 is a cross-sectional view of conductive pads on a substrate with a release layer, and dummy layer, as shown in FIG. 9, in accordance with an illustrative embodiment.

FIG. 10 is a cross-sectional view of conductive pads on a substrate with a release layer, and dummy layer, as shown in FIG. 9, in accordance with an illustrative embodiment.

Subsequent to the formation of metal layer 136 and metal interlayer 134, the metal layer 136 and metal interlayer 134 may be chemically-mechanically polished to remove excess metal and reduce the height of the metal layer 136, so only conductive pad(s) 135 separated by the resist material of dummy layer 130 remain. The chemical-mechanical polishing may provide conductive pad(s) 135 with flat planar exposed surfaces 137 for the formation of subsequent layers, where electrical contact may be made with the exposed surfaces 137 without interference by the resist material of dummy layer 130.

Figure 11:
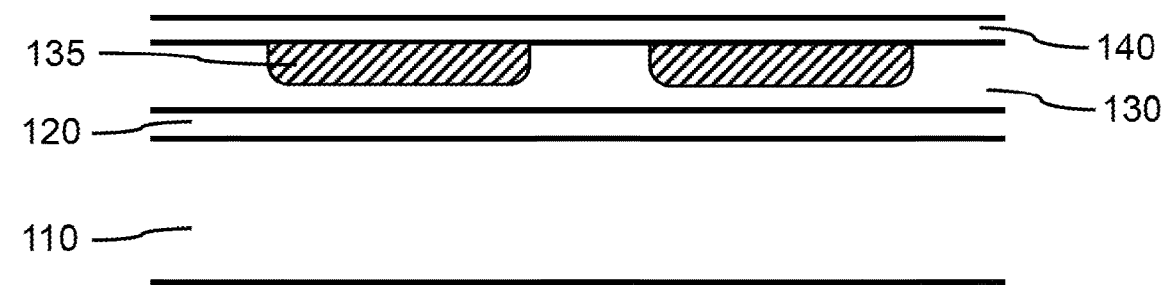
FIG. 11 is a cross-sectional view of a substrate with a release layer, dummy layer, and conductive pads, as shown in FIG. 10, and a tie layer in accordance with an illustrative embodiment.

FIG. 11 is a cross-sectional view of a substrate with a release layer, dummy layer, and conductive pads, as shown in FIG. 10, and a tie layer in accordance with an illustrative embodiment.

In one or more embodiments, a tie layer 140 may be formed on the dummy layer 130 and conductive pads 135. The tie layer 140 may be a titanium/copper (Ti/Cu) layer, where a thin Ti layer may be deposited on the dummy layer 130 and conductive pads 135 first followed by a Cu layer wet-chemically or electrochemically deposited (e.g., electroplated) on the Ti layer, where the Ti layer may be a wetting/seed layer and/or barrier layer for the deposited copper. In various embodiments, other metals (e.g., Mo, Hf, Ta, etc.) may be used in place of the titanium.

In one or more embodiments, the Ti layer of the tie layer 140 may have a thickness in the range of about 1 nm to about 25 nm, or in the range of about 5 nm to about 25 nm, or in the range of about 10 nm to about 20 nm. The Ti layer may be formed by PVD (e.g., sputtering). If other metals are used in place of titanium, the thickness range may be adjusted to maintain an electrical resistance comparable to a titanium layer and sufficient to detect the resistance through an alternate conductive path 145 of the tie layer 140 compared to a conductive path 165 through the interposer.

In one or more embodiments, the Cu layer of the tie layer 140 may have a thickness in the range of about 30 nm to about 100 nm, or in the range of about 40 nm to about 75 nm. The Cu layer may be formed by PVD (e.g., sputtering).

In one or more embodiments, the thickness of the tie layer 140 may be adjusted to provide a predetermined sheet resistance for comparison to a resistance measurement across a conductive path 165 between at least two contact points. A defect may be detected by an increase in a measured resistance from $R_1$ to $R_2$ for the alternate conductive path 145, where $R_2 > R_1$. The resistances may be measured by a four-point probe method. Electrical resistance of the tie layer 140 (Ti—Cu layer) may be less than 35 ohm/sq.

Figure 12:
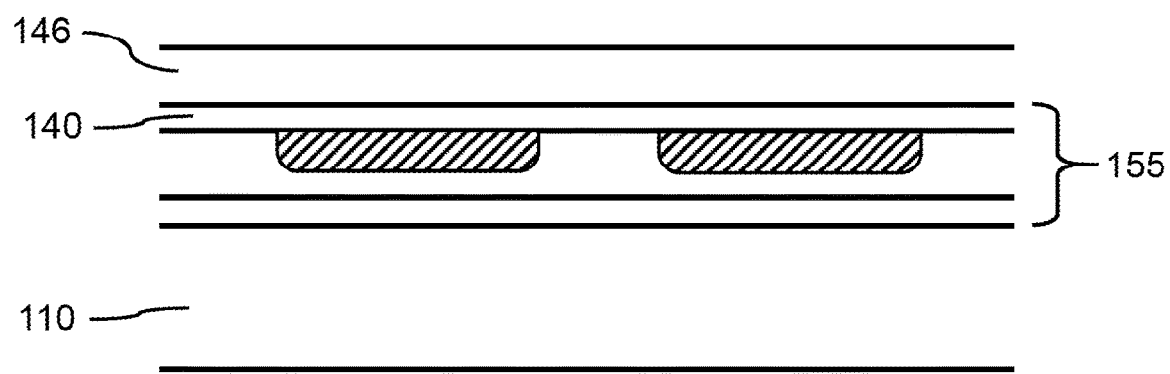
FIG. 12 is a cross-sectional view of a substrate with a release layer, dummy layer, conductive pads, and tie layer, as shown in FIG. 11, and a dry film in accordance with an illustrative embodiment.

FIG. 12 is a cross-sectional view of a substrate with a release layer, dummy layer, conductive pads, and tie layer, as shown in FIG. 11 and a dry film in accordance with an illustrative embodiment.

In one or more embodiments, a photosensitive dry film 146 may be placed on at least a portion of tie layer 140, where the photosensitive dry film 146 may have a thickness in the range of about 20 um to about 30 um, although other thicknesses are contemplated. In various embodiments, the release layer 120, dummy layer 130, conductive pads 135, and tie layer 140 may form a sacrificial test structure 155.

In various embodiments, the photosensitive dry film 146 may be a novolac or acrylic resin.

Figure 13:
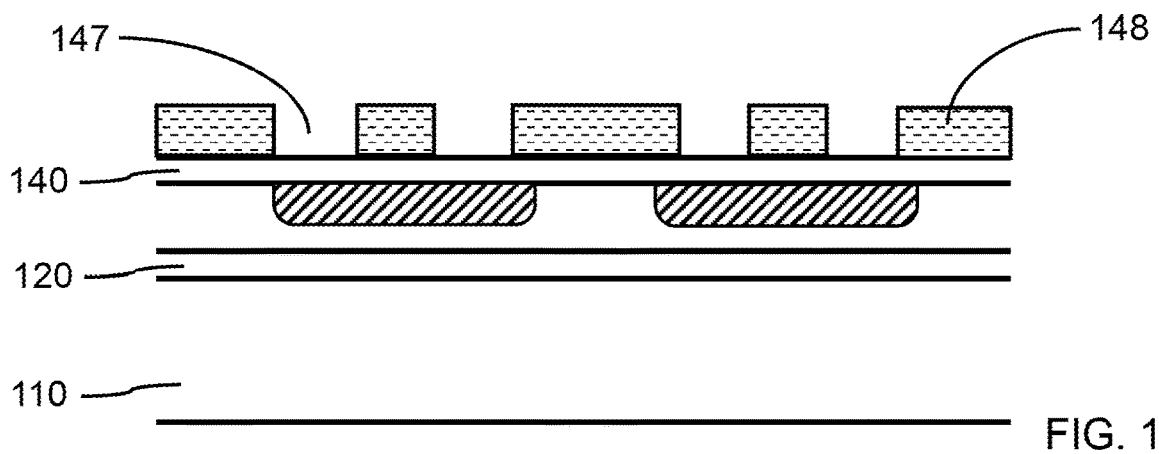
FIG. 13 is a cross-sectional view of a substrate with a release layer, dummy layer, conductive pads, tie layer, and photosensitive dry film, as shown in FIG. 12, in accordance with an illustrative embodiment.

FIG. 13 is a cross-sectional view of a substrate with a release layer, dummy layer, conductive pads, tie layer, and photosensitive dry film, as shown in FIG. 12, in accordance with an illustrative embodiment.

The photosensitive dry film 146 may be exposed and developed to form one or more cavities 147 in the photosensitive dry film 146, where the cavities 147 may be separated by dry film spacers 148 on opposite sides and/or surrounding the cavities 147.

Figure 14:
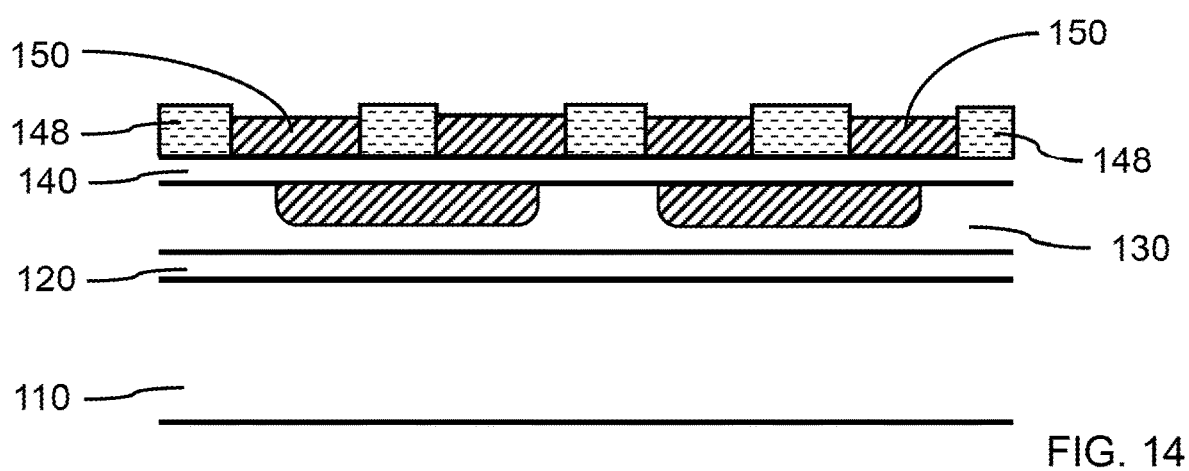
FIG. 14 is a cross-sectional view of a substrate with a release layer, dummy layer, conductive pads, tie layer, and photosensitive dry film, as shown in FIG. 13, and interposer via contacts in accordance with an illustrative embodiment.

FIG. 14 is a cross-sectional view of a substrate with a release layer, dummy layer, conductive pads, tie layer, and photosensitive dry film, as shown in FIG. 13, and interposer via contacts in accordance with an illustrative embodiment.

In one or more embodiments, interposer via contacts 150 may be formed on the tie layer 140 in the cavities 147 between the dry film spacers 148. In various embodiments, the interposer via contacts 150 may be formed by electroplating copper on the exposed portions of the tie layer 140. The electroplating of copper may occur preferentially on the surface of the tie layer 140, without depositing the copper on the dry film spacers 148. The copper may be deposited to a thickness in the range of about 5 um to about 30 um, or about 10 um to about 20 um, or about 12 um to about 18 um.

Figure 15:
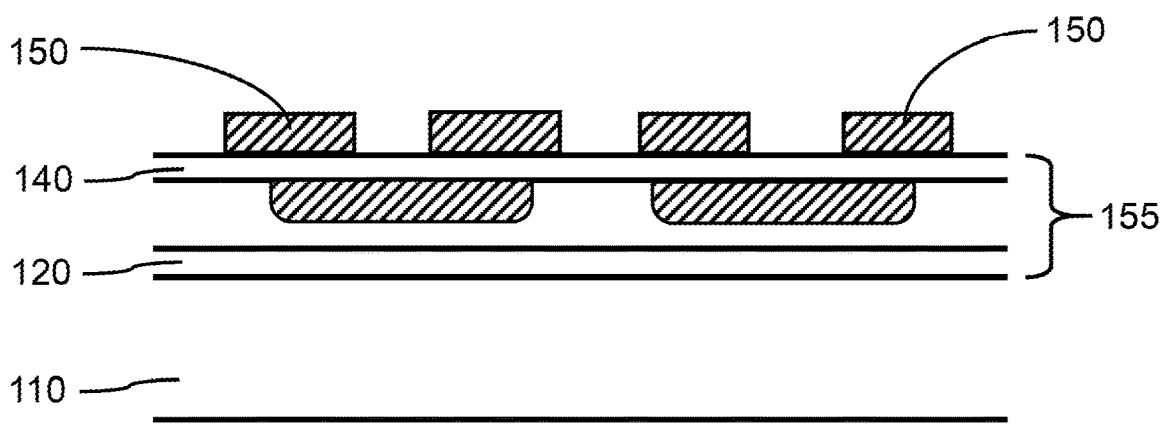
FIG. 15 is a cross-sectional view of a substrate with a sacrificial test structure, and interposer via contacts of an interposer, as shown in FIG. 14, in accordance with an illustrative embodiment.

FIG. 15 is a cross-sectional view of a substrate with a sacrificial test structure, and interposer via contacts of an interposer, as shown in FIG. 14, in accordance with an illustrative embodiment.

In one or more embodiments, the photosensitive dry film 146 may be removed from between the interposer via contacts 150 to leave the interposer via contacts 150 remaining on portions of the tie layer 140, where the tie layer is part of a sacrificial test structure 155. The photosensitive dry film 146 may be removed by methods known in the art. In various embodiments, the copper layer of the tie layer 140 having a Ti/Cu bi-layer and the copper of the interposer via contacts 150 may be etched to remove the exposed copper of the tie layer 140, thereby leaving the Ti of the tie layer between the interposer via contacts. The remaining titanium of the tie layer 140 has a higher resistance than the tie layer with the copper component, which may allow a detectable difference in conductive path resistance, as discussed for FIG. 2.

Figure 16:
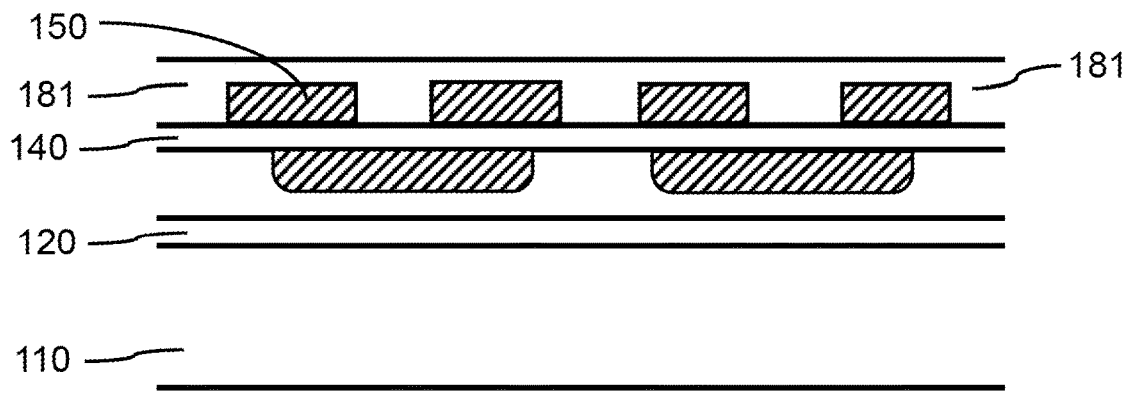
FIG. 16 is a cross-sectional view of a substrate with a sacrificial test structure, and interposer contacts, as shown in FIG. 15, with an insulator layer in accordance with an illustrative embodiment.

FIG. 16 is a cross-sectional view of a substrate with a sacrificial test structure, and interposer contacts, as shown in FIG. 15, with an insulator layer in accordance with an illustrative embodiment.

In one or more embodiments, an insulator material 181 may be formed on the exposed surface portions of tie layer 140 and interposer contacts 150 to electrically separate the interposer contacts. The insulator material 181 may prevent the conductive path from shorting through the interposer body 105. A conductive path 165 between two or more chip contact(s) 170 may, thereby, be limited to an interposer via(s) 160, where the conductive path be traced from chip contacts 170, through the interposer via 160, to interposer contacts 150, through the tie layer 140, and interposer lead contacts 190 to an interposer lead 195.

In one or more embodiments, the insulator material 181 may form a layer, where the layer may have a thickness in the range of about 10 um to about 50 um, or in the range of about 15 um to about 40 um, or in the range of about 20 um to about 30 um, or about 25 um. In various embodiments, the insulator material 181 may be an organic insulator material, for example, polyimide, epoxy resin, SU-8, etc.

Figure 17:
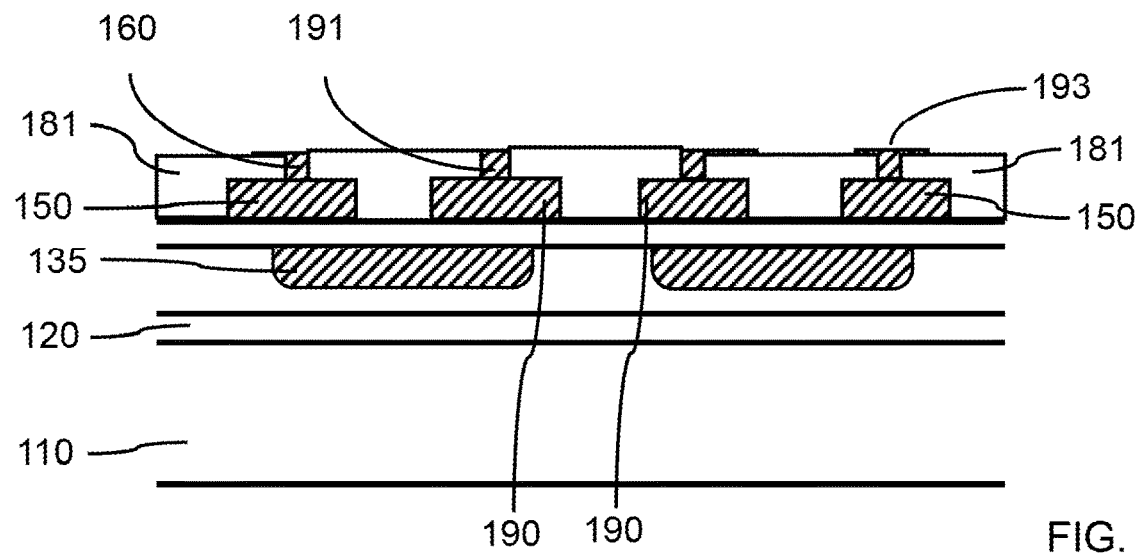
FIG. 17 is a cross-sectional view of a substrate with a sacrificial test structure, interposer contacts, and an insulator material layer, as shown in FIG. 16, with vias and leads in accordance with an illustrative embodiment.

FIG. 17 is a cross-sectional view of a substrate with a sacrificial test structure, interposer contacts, and an insulator material layer, as shown in FIG. 16, with vias and leads in accordance with an illustrative embodiment.

In various embodiments, the insulator material 181 may be planarized (e.g., by chemical-mechanical polishing) prior to other processing step to provide a uniform surface and/or thickness. In various embodiments, one or more vertical openings may be formed in the layer of insulator material 181, where the openings may be positioned above one or more of the interposer contacts 150, 190, which may be used to subsequently form one or more interposer via contacts 150 and/or two or more interposer lead contacts 190. The openings may be formed by an ultraviolet or excimer laser.

In one or more embodiments, a layer of a conductor (e.g., Ti/Cu or electrodeless copper) may be deposited on at least a portion of the insulator material 181 and in one or more of the openings. The opening(s) may be filled with Ti/Cu or Cu to form the interposer via 160 or leads 191. Excess Ti/Cu or Cu may be removed from the top surface of the insulator material 181 by CMP to provide a flat uniform surface.

Figure 18:
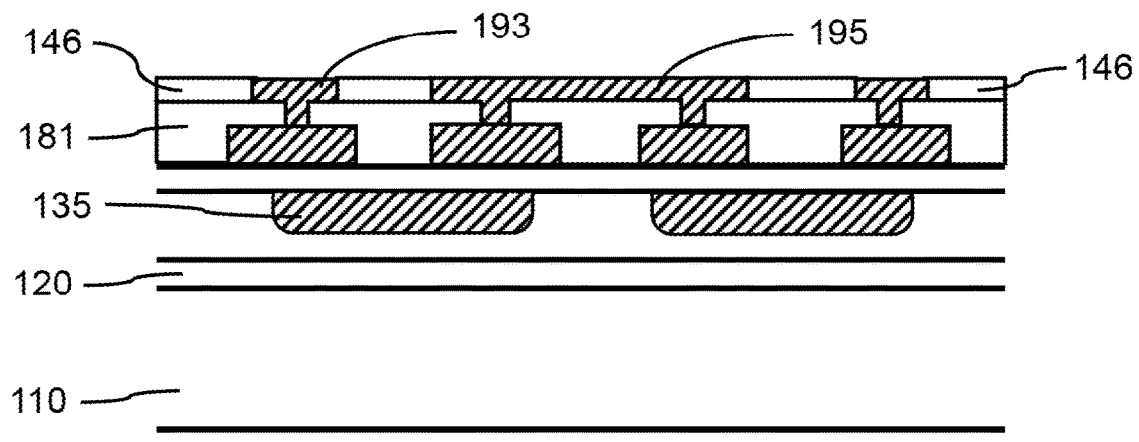
FIG. 18 is a cross-sectional view of a substrate with a sacrificial test structure, interposer contacts, a first layer of insulator material layer, as shown in FIG. 17, and a photosensitive dry film in accordance with an illustrative embodiment.

FIG. 18 is a cross-sectional view of a substrate with a sacrificial test structure, interposer contacts, a first layer of insulator material layer, as shown in FIG. 17, and a photosensitive dry film in accordance with an illustrative embodiment.

In various embodiments, a photosensitive dry film 146 may be placed on at least a portion of the layer of insulator material 181, and the photosensitive dry film 146 patterned and developed to provide openings above the vias 160 and leads 191. The photosensitive dry film 146 may have a thickness in the range of about 5 um to about 10 um. The photosensitive dry film 146 may be patterned and developed to form an open channel for subsequent formation of one or more interposer lead 195 or channels 193.

In various embodiments, the openings may be filled with copper to form conductive pads and/or channels 193 that may form power or ground planes in the interposer. The openings may be filled with copper to form one or more interposer lead(s) 195, where the interposer lead 195 may connect two or more leads 191. In various embodiments, the copper may be electroplated on to the Ti/Cu or electrodeless copper previously deposited. Excess Ti/Cu or Cu may be removed from the top surface of the photosensitive dry film 146 by CMP to provide a flat uniform surface.

Figure 19:
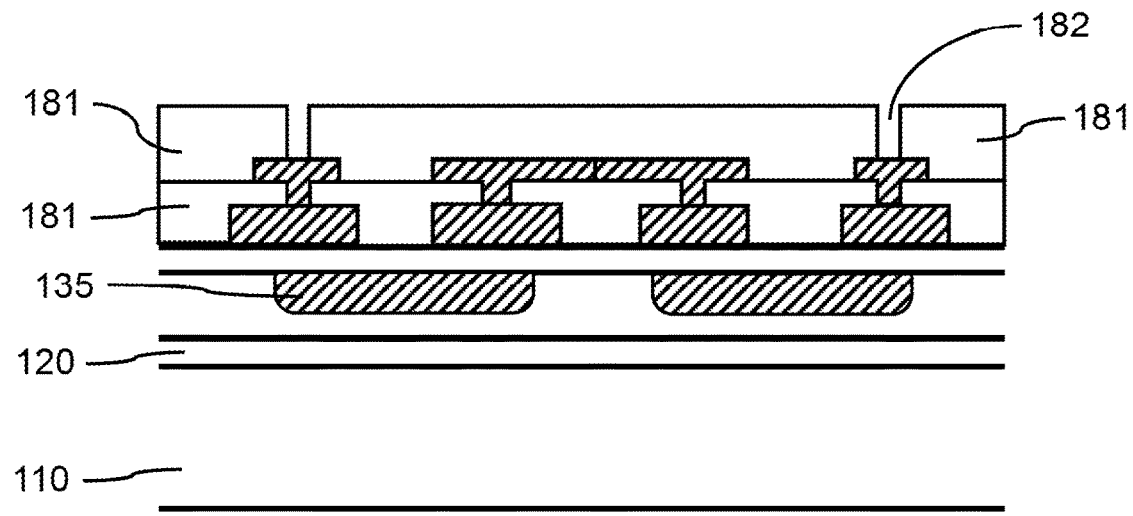
FIG. 19 is a cross-sectional view of a substrate with a sacrificial test structure, interposer contacts, a first layer of insulator material layer, as shown in FIG. 18, and a second layer of insulator material in accordance with an illustrative embodiment.

FIG. 19 is a cross-sectional view of a substrate with a sacrificial test structure, interposer contacts, a first layer of insulator material layer, as shown in FIG. 18, and a second layer of insulator material in accordance with an illustrative embodiment.

In one or more embodiments, an insulator material 181 may be formed on the exposed surface portions of the conductive pads and/or channels 193, and/or interposer lead(s) 195 to electrically insulate the conductive pads and/or channels 193, and/or interposer lead(s) 195, thereby limiting a conductive path between interposer via contacts 150 and/or chip contacts 170, to an interposer via 160, and or interposer lead contacts 190 to an interposer lead 195, and/or the tie layer 140.

In various embodiments, the insulator material 181 may be planarized (e.g., by chemical-mechanical polishing) prior to other processing step to provide a uniform surface and/or thickness. In various embodiments, one or more vertical openings 182 may be formed in the layer of insulator material 181, where the openings 182 may be positioned above one or more of the interposer contacts, which may be used to subsequently form one or more interposer via contacts 150 and/or two or more interposer lead contacts 190.

In one or more embodiments, a layer of Ti/Cu or electrodeless copper may be deposited on at least a portion of the insulator material 181 and in one or more of the openings. The vias may be filled with Ti/Cu or Cu to form the interposer via 160 or leads 191. Excess Ti/Cu or Cu may be removed from the top surface of the insulator material 181 by CMP to provide a flat uniform surface. The entire process of forming insulator material 181, vias 160 and/or leads 191 may be repeated to form additional layers.

Figure 20:
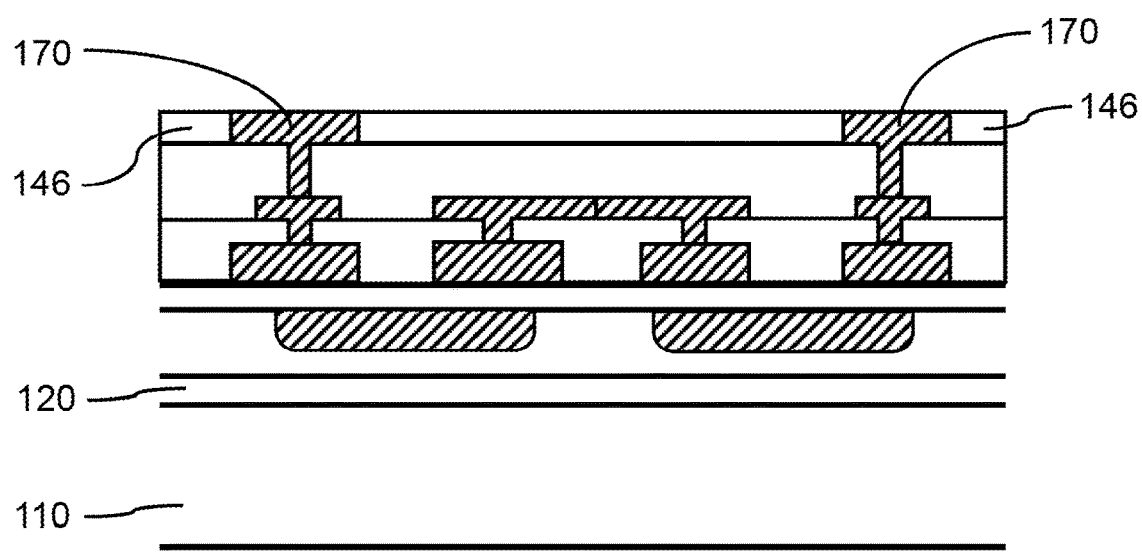
FIG. 20 is a cross-sectional view of a substrate with a sacrificial test structure, interposer contacts, multiple layers of insulator material, as shown in FIG. 19, and chip contacts in accordance with an illustrative embodiment.

FIG. 20 is a cross-sectional view of a substrate with a sacrificial test structure, interposer contacts, multiple layers of insulator material, as shown in FIG. 19, and chip contacts in accordance with an illustrative embodiment.

In various embodiments, a photosensitive dry film 146 may be placed on at least a portion of the layer of insulator material 181, and the photosensitive dry film 146 patterned and developed to provide openings above the vias 160 and/or leads 191. The photosensitive dry film 146 may have a thickness in the range of about 5 um to about 10 um. The photosensitive dry film 146 may be patterned and developed to form one or more openings and/or channels for subsequent formation of one or more chip contacts 170. Copper may be deposited in the openings to form chip contacts 170.

After formation of the one or more chip contacts 170, the remaining portions of the photosensitive dry film 146 may be removed, as would be known in the art. In various embodiments, electrodeless nickel immersion gold (ENIG) may be applied to the exposed surfaces of the chip contacts 170.

In various embodiments, the sequence of forming a layer of insulator material 181 on an underlying layer followed by patterning and developing of a photosensitive dry film 146 to form a suitable patter of openings for subsequent via, lead, pad, and channel formation may be repeated multiple times to form an overall structure as desired. The structure may be configured and dimensioned to electrically connect ultra-high density circuitry, which may be in the form of a vertical or horizontal die stack, with second level packaging.

In various embodiments, an interposer may be tested using the sacrificial test structure 155 before the sacrificial interposer test structure is bonded to a handling support for transfer to a level-two package, where the interposer may be bonded to packaging contacts for use in electrically interconnecting one or more dies to a package.

The interposer 100 may be tested by attaching a test probe to each of the chip contacts 170 forming the end-points of a closed circuit through the interposer and sacrificial test structure 155. The resistances for each conductive path formed through the interposer and/or sacrificial test structure 155 may be measured by a four-point probe method to determine if any conductive path has a higher (i.e., greater (e.g., 2-times, 3-times, etc.) than expected or infinite resistivity (i.e., is an open circuit) for the conductor material(s)). The testing may be repeated for each conductive path through the interposer.

In one or more embodiments, the interposer 100 includes an interposer body 105, one or more interposer via contacts 150, and two or more interposer lead contacts 190 embedded in the interposer body 105, wherein each of the one or more interposer via contacts 150 and two or more interposer lead contacts 190 has an exposed surface. A plurality of the one or more interposer via contact surfaces and/or two or more interposer lead contact surfaces may be in electrical contact with at least one of the one or more conductive pads 135.

In one or more embodiments, the interposer body 105 may include one or more layers of insulator material 181. One or more interposer chip contacts 170, one or more interposer via contacts 150, one or more leads 191, and/or one or more interposer leads 195 may be embedded in the one or more layers of insulator material 181 forming the interposer body. One or more of the interposer leads 195 may form an electrical connection between two or more interposer lead contacts 190. An interposer via 160 may form an electrical connection between a chip contact 170 and an interposer via contact 150. In various embodiments, at least two interposer chip contacts 170 may be electrically connected through at least one of the one or more conductive pads 135.

Figure 21:
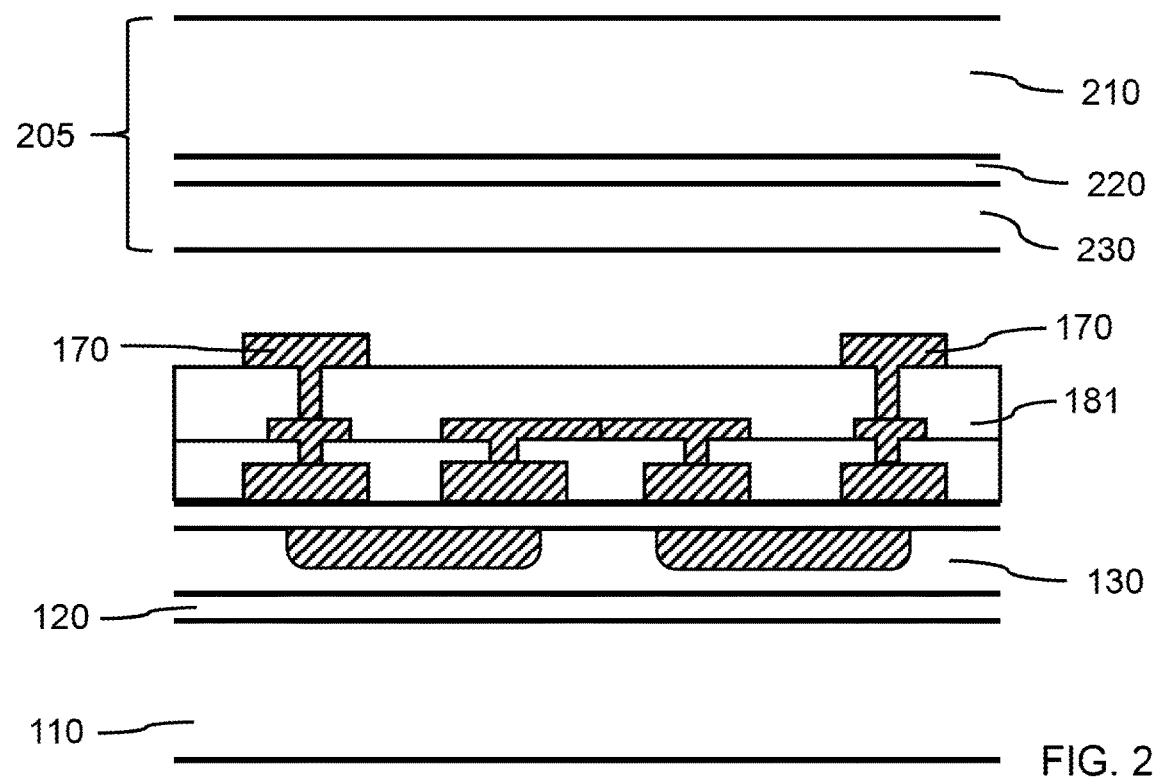
FIG. 21 is a cross-sectional view of a substrate with a sacrificial test structure and an interposer, as shown in FIG. 20, and a handling structure in accordance with an illustrative embodiment.

FIG. 21 is a cross-sectional view of a substrate with a sacrificial test structure and an interposer, as shown in FIG. 20, and a handling structure in accordance with an illustrative embodiment.

In various embodiments, a handling structure 205, including a support 210, a release layer 220, and an adhesive layer 230 may be brought into contact with a top surface of a sacrificial interposer test structure.

Figure 22:
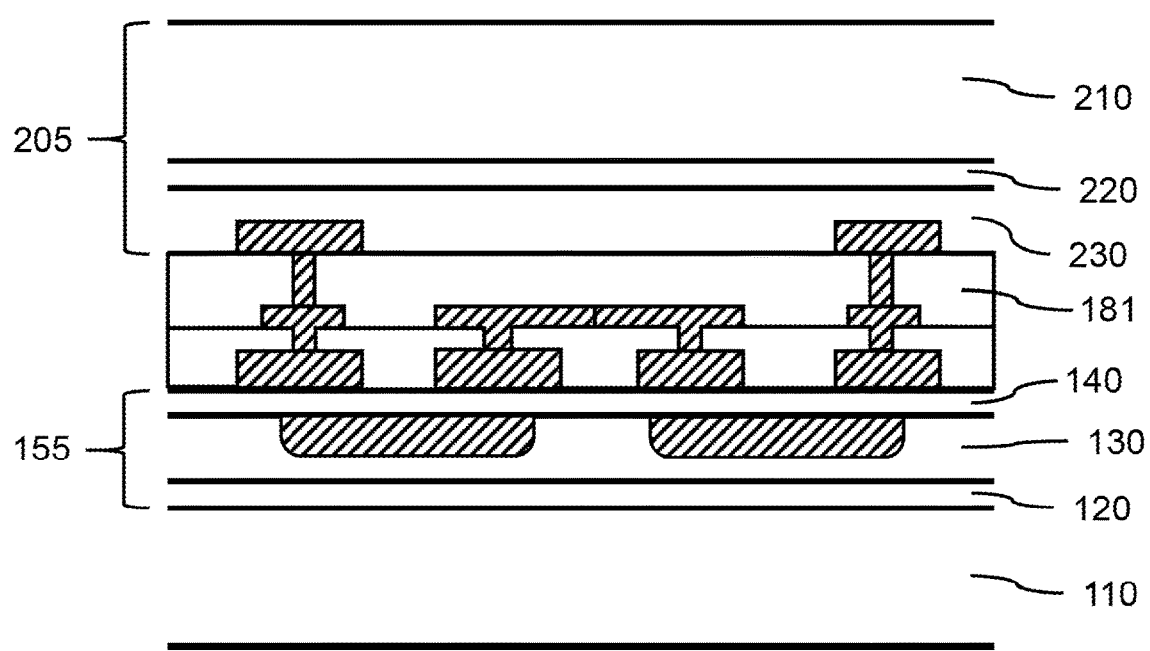
FIG. 22 is a cross-sectional view of a substrate with a sacrificial test structure and an interposer, as shown in FIG. 21, with an attached handling structure in accordance with an illustrative embodiment.

FIG. 22 is a cross-sectional view of a substrate with a sacrificial test structure and an interposer, as shown in FIG. 21, with an attached handling structure in accordance with an illustrative embodiment.

In one or more embodiments, a handling structure 205 may be attached to a top surface of the sacrificial interposer test structure using an adhesive that bonds the support 210 and release layer 220 to the insulator material 181 and chip contacts 170. The handling structure 205 may be affixed to the exposed surface of the interposer 100 by the adhesive layer 230, such that the chip contacts 170 are in contact with the adhesive layer 230 and insulator material 181.

Figure 23:
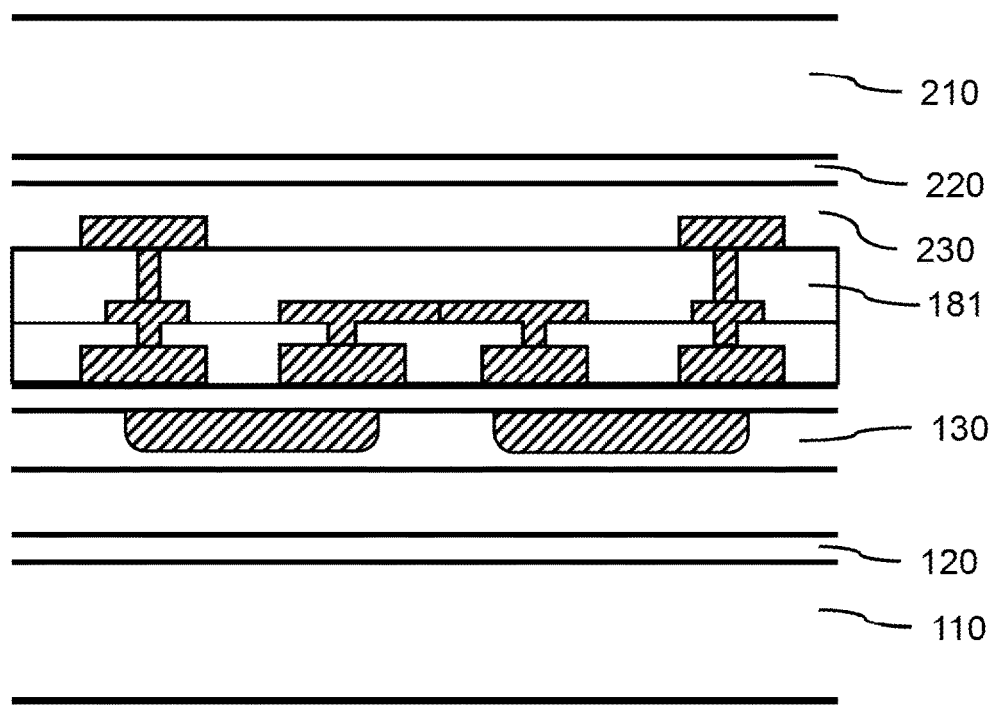
FIG. 23 is a cross-sectional view of a sacrificial test structure, an interposer, and a handling structure, as shown in FIG. 22, with a detached substrate in accordance with an illustrative embodiment.

FIG. 23 is a cross-sectional view of a sacrificial test structure, an interposer, and a handling structure, as shown in FIG. 22, with a detached substrate in accordance with an illustrative embodiment.

In one or more embodiments, the substrate 110 may be separated from the sacrificial interposer test structure at release layer 120. In various embodiments, the substrate 110 may be separated from the sacrificial interposer test structure by applying energy to the interface between the release layer 120 and the substrate 110. In various embodiments, the substrate 110 may be separated from the release layer leaving the dummy layer 130, conductive pad(s) 135, and tie layer 140 remaining on the interposer.

In one or more embodiments, the substrate 110 may be separated from the sacrificial interposer test structure at release layer 120 by applying a mechanical stress, a thermal stress, and/or generating voids or bubbles at the interface. In various embodiments, the substrate 110 may be separated from the sacrificial interposer test structure by applying a torsional or tensile stress to the release layer 120 by twisting or pulling the substrate 110 and sacrificial interposer test structure apart. In various embodiments, the substrate 110 may be separated from the sacrificial interposer test structure by heating the release layer 120 to soften the release layer material and/or generate bubbles at the interface and twisting or pulling the substrate 110 and sacrificial interposer test structure apart. In various embodiments, the substrate 110 may be separated from the sacrificial interposer test structure by exposing the release layer 120 to a laser beam to create micro-voids at the interface and twisting or pulling the substrate 110 and sacrificial interposer test structure apart. The heating or laser exposure may reduce the interfacial bonding strength, and reduce the mechanical energy required to separate the layers. In various embodiments, the substrate 110 may be separated from the release layer by exposing the interface between the release layer 120 and the substrate 110 to a laser.

Figure 24:
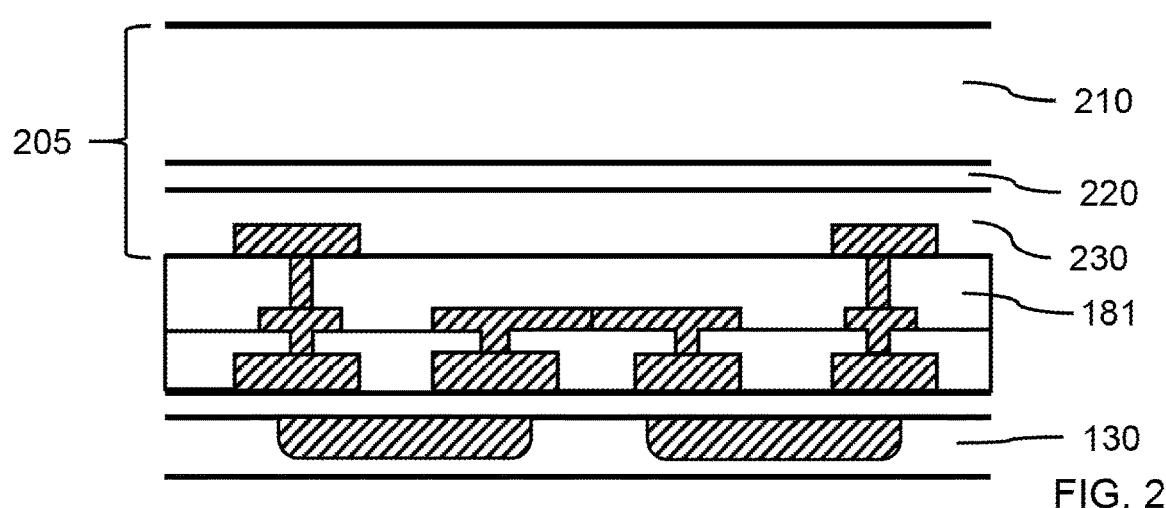
FIG. 24 is a cross-sectional view of a sacrificial test structure, an interposer, and a handling structure, as shown in FIG. 23, in accordance with an illustrative embodiment.

FIG. 24 is a cross-sectional view of a sacrificial test structure, an interposer, and a handling structure, as shown in FIG. 23, in accordance with an illustrative embodiment.

In one or more embodiments, the dummy layer 130, conductive pad(s) 135, and tie layer 140 may be removed from the bottom surface of the interposer by chemical-mechanical polishing.

Figure 25:
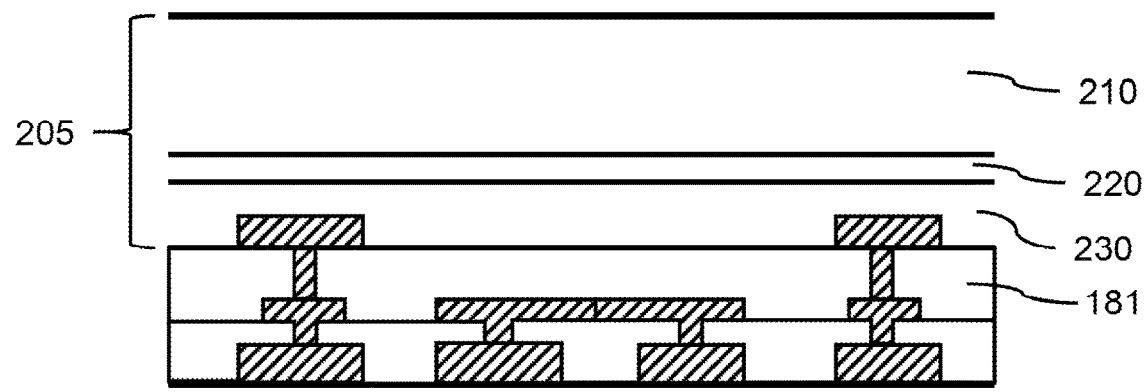
FIG. 25 is a cross-sectional view of an interposer and a handling structure in accordance with an illustrative embodiment.

FIG. 25 is a cross-sectional view of an interposer and a handling structure in accordance with an illustrative embodiment.

Etching may be used to remove any remaining portion of the tie layer remaining on the bottom surface of the interposer. In various embodiments, electrodeless nickel immersion gold (ENIG) may be applied to the exposed surfaces of the interposer via contacts 150 and interposer lead contacts 190. In various embodiments, a non-conductive film (NCF) or benzocyclobutene (BCB) lamination may be applied to the bottom surface of the interposer. The Interposer may be diced to separate different internal components (e.g., interposer lead contacts 190 and interposer leads 195) for placement and bonding to a package. Dicing may allow different portions of the interposer to be used in different sections of the packaging, and may relieve built-up stresses that may otherwise cause the interposer to warp when removed from the rigid substrate 110. Dicing can also allow selection of good interposer segments for use before attachment resulting in a higher yield of functional interposers and devices.

Figure 26:
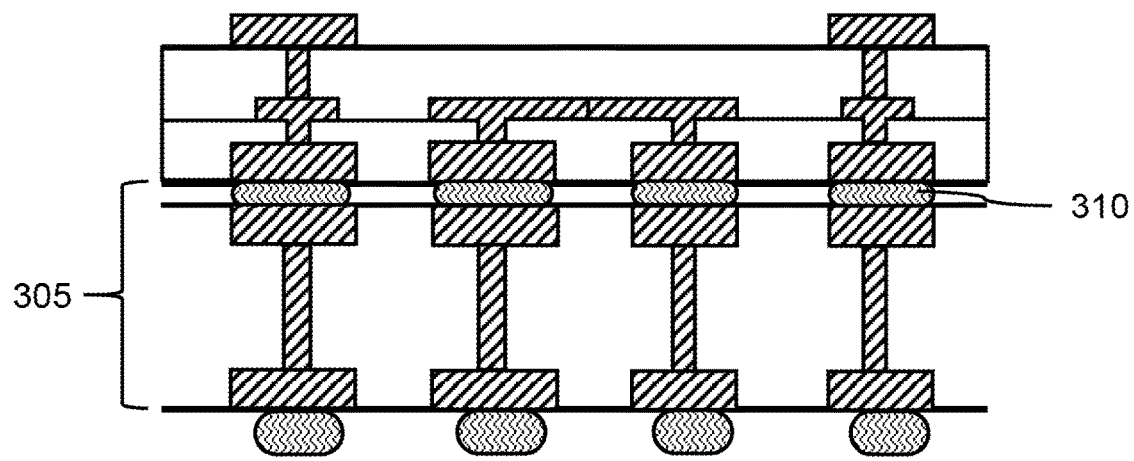
FIG. 26 is a cross-sectional view of an interposer bonded to a package in accordance with an illustrative embodiment.

FIG. 26 is a cross-sectional view of an interposer bonded to a package in accordance with an illustrative embodiment.

After testing, preparation, and cleaning the interposer may be attached to a level two package 305. In one or more embodiments, the interposer may be bonded to the bonding pads 310 of a level 2 package 305, and the support structure 205 removed at the release layer 220 by exposing the release layer to energy (e.g., laser). The remaining adhesive may be removed from the top surface of the interposer.

Having described preferred embodiments of sacrificial interposer test structure fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An interposer test structure attached to a device, comprising:

a bonding pad affixed to each of two or more interposer via contacts and each of two or more interposer lead contacts, wherein the two or more interposer via contacts and two or more interposer lead contacts are embedded in an insulator material layer;

a first interposer via in physical and electrical contact with a first interposer via contact, and a second interposer via in physical and electrical contact with a second interposer via contact of the two or more interposer via contacts;

a first lead in physical and electrical contact with a first of the two or more interposer lead contacts, and a second lead in physical and electrical contact with a second of the two or more interposer lead contacts;

two or more chip contacts, wherein one of the two or more chip contacts is in physical and electrical contact with the first interposer via and another of the two or more chip contacts is in physical and electrical contact with the second interposer via; and an interposer lead embedded in the insulator material layer, and in physical and electrical contact with the first and second leads.

2. The interposer test structure of claim 1, wherein the interposer via contacts and interposer lead contacts each have a thickness in a range of about 5 um to about 30 um.

3. The interposer test structure of claim 1, wherein the interposer via contacts and interposer lead contacts are copper.

4. The interposer test structure of claim 1, wherein the insulator material layer is polyimide or epoxy resin.

5. The interposer test structure of claim 1, wherein the interposer vias are titanium copper (Ti/Cu).

6. The interposer test structure of claim 1, wherein the interposer vias have a diameter in the range of about 10 um to about 25 um.

7. The interposer test structure of claim 1, further comprising one or more channels in the insulator material layer, wherein the channels are filled with copper.

8. The interposer test structure of claim 7, wherein one of the one or more channels is electrically connected to one of the separate interposer vias.

9. A method of using an interposer test structure, comprising:

forming a plurality of conductive pads on a substrate;

depositing a tie layer on at least two of the plurality of conductive pads, wherein the tie layer is in electrical contact with the at least two of the plurality of conductive pads;

forming four interposer contacts in an insulator layer, wherein each of the four interposer contacts is in physical and electrical contact with the tie layer;

forming an interposer lead electrically connecting two of the four interposer contacts;

forming a separate chip contact to each of two of the four interposer contacts other than the two interposer contacts electrically connected by the interposer lead, wherein the two chip contacts, four interposer contacts, tie layer, and interposer lead form an electrical path; and measuring the resistance across the electrical path.

10. The method of claim 9, wherein the interposer via contacts and interposer lead contacts each have a thickness in a range of about 5 um to about 30 um.

11. The method of claim 10, wherein the interposer via contacts and interposer lead contacts are copper.

12. The method of claim 11, wherein the insulator material layer is polyimide or epoxy resin.

13. The method of claim 12, further comprising forming a separate interposer via between each chip contact and one of the two interposer contacts.

14. The method of claim 13, wherein the interposer vias have a diameter in the range of about 10 um to about 25 um.

15. A method of testing an interposer, comprising:

forming an interposer on a sacrificial test structure, wherein the interposer includes a body and a plurality of electrically connected interposer contacts and chip contacts embedded in the body, where at least a portion of the electrically connected interposer contacts are in electrical contact with the sacrificial test structure, wherein the sacrificial test structure includes a conductive tie layer in contact with the interposer contacts; and attaching at least two test probes to at least two different chip contacts on the surface of the interposer, wherein a resistance between the electrically connected interposer contacts is measured to determine if a conductive path between the electrically connected interposer contacts is open or closed.

16. The method of claim 15, wherein the sacrificial test structure includes one or more conductive pads in contact with the conductive tie layer, wherein the conductive pads form a conductive bridge between two or more interposer contacts, such that a resistance for a complete conductive path between two chip contacts can be measured.

17. The method of claim 16, wherein the sacrificial test structure includes a release layer, and a substrate in contact with the release layer, wherein the release layer couples the tie layer to the substrate.

18. The method of claim 17, further comprising discarding the interposer in response to determining the resistance for the complete conductive path between two chip contacts indicates the interposer is defective.

19. The method of claim 17, further comprising coupling the interposer to a handling structure, and separating the substrate from the sacrificial test structure at the release layer after measuring the resistance for the complete conductive path between two chip contacts.

20. The method of claim 19, wherein the release layer is titanium, and the substrate is separated from the sacrificial test structure by exposing the release layer to laser light.

* * * * *